United States Patent
Arase et al.

(10) Patent No.: US 6,617,255 B2
(45) Date of Patent: Sep. 9, 2003

(54) PLASMA PROCESSING METHOD FOR WORKING THE SURFACE OF SEMICONDUCTOR DEVICES

(75) Inventors: Takao Arase, Kudamatsu (JP); Motohiko Yoshigai, Hikari (JP); Go Saito, Hikari (JP); Masamichi Sakaguchi, Kudamatsu (JP); Hiroaki Ishimura, Kudamatsu (JP); Takahiro Shimomura, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/799,485

(22) Filed: Mar. 7, 2001

(65) Prior Publication Data

US 2001/0055885 A1 Dec. 27, 2001

(30) Foreign Application Priority Data

Jun. 13, 2000 (JP) .................................... 2000-182306

(51) Int. Cl.⁷ ............................................. H01L 21/302
(52) U.S. Cl. ..................... 438/706; 438/714; 438/724
(58) Field of Search ............................... 438/706–714, 438/717, 718, 724, 728, 744

(56) References Cited

U.S. PATENT DOCUMENTS

| | | | | |
|---|---|---|---|---|
| 6,136,211 A | * | 10/2000 | Qian et al. | 216/37 |
| 6,146,954 A | * | 11/2000 | Klein et al. | 438/305 |
| 6,180,533 B1 | * | 1/2001 | Jain et al. | 438/714 |
| 6,235,643 B1 | * | 5/2001 | Mui et al. | 438/719 |
| 6,287,974 B1 | * | 9/2001 | Miller | 438/706 |

\* cited by examiner

*Primary Examiner*—Benjamin L. Utech
*Assistant Examiner*—Duy-Vu Deo
(74) *Attorney, Agent, or Firm*—Antonelli, Terry, Stout & Kraus, LLP

(57) ABSTRACT

A plasma processing method is provided of processing a sample having a silicon nitride layer with high accuracy of size in anisotropy and excellent selectivity to a silicon oxide layer as underlayer. A mixed atmosphere of chlorine gas containing no fluorine with aluminum is converted into plasma in a plasma etching processing chamber and the sample having the silicon nitride layer is etched by using the plasma.

3 Claims, 6 Drawing Sheets

PLASMA PROCESSING METHOD FOR WORKING THE SURFACE OF SEMICONDUCTOR DEVICES

BACKGROUND OF THE INVENTION

The present invention relates to a plasma processing method of processing the surface of semiconductor devices, and more particularly to such a plasma processing method suitable for etching of a silicon nitride film.

A method using plasma is widely employed to work or process semiconductor devices. In the prior art, as the plasma used to etch a silicon nitride layer, plasma of a mixed gas of fluorine-containing gas as a main component with hydrogen-containing gas and oxygen-containing gas is utilized as disclosed in U.S. Pat. No. 5,756,402.

SUMMARY OF THE INVENTION

In recent years, with the high integration of semiconductor devices, miniaturization or fine patterning thereof is required. For this purpose, the accuracy of size for etching a lightly doped drain (hereinafter abbreviated to LDD) spacer influencing a length of a gate channel of a metal oxide semiconductor (MOS) is important. Further, recently, with the high integration of semiconductor devices, a method of forming the LDD spacer of a silicon nitride layer is used in order to apply the self-alignment contact (SAC) technique thereto. Accordingly, the etching technique of the LDD spacer requires the high accuracy of size in the anisotropy and the high selectivity to the silicon oxide layer constituting the underlayer.

FIG. 8 shows a cross section of a sample fabricated by etching the silicon nitride layer using fluorine-containing gas as a main component in the prior art. In the initial state of the fabrication of the sample, as shown in FIG. 1A, after a gate oxide layer 102 made of a silicon oxide, a gate electrode 104 made of a polycrystal silicon, a mask 106 for the gate electrode 104 and a gate covering insulation layer 103 made of a silicon oxide have been formed, a silicon nitride layer 105 is formed thereon. When fluorine-containing gas is used as etching gas, a rate selectivity (selectivity) of the silicon nitride layer to the silicon oxide layer can be made larger, the isotropy is strengthened and the side etching is produced in the silicon nitride layer 105 as shown in FIG. 8. In addition, the silicon nitride layer on the side of the gate electrode 104 is narrowed and the processing accuracy in size is deteriorated.

It is an object of the present invention to solve the above problems by providing a plasma processing method capable of increasing a selectivity of a silicon nitride layer to a silicon oxide layer constituting the underlayer and improving the processing accuracy in size of the silicon nitride layer.

In order to solve the above problem, according to an aspect of the present invention, the silicon nitride layer is etched using halogen such as chlorine gas containing no fluorine to thereby prevent isotropic etching of the silicon nitride layer and a semiconductor device is processed by means of plasma mixed with aluminum in order to suppress the etching rate of the silicon oxide layer.

Other objects, features and advantages of the present invention will become apparent from the following description of the embodiments of the invention taken in conjunction with the accompanying drawings.

DETAILED DESCRIPTION OF THE EMBODIMENTS

An embodiment of the present invention is now described with reference to FIGS. 1 to 5.

Figure 2:
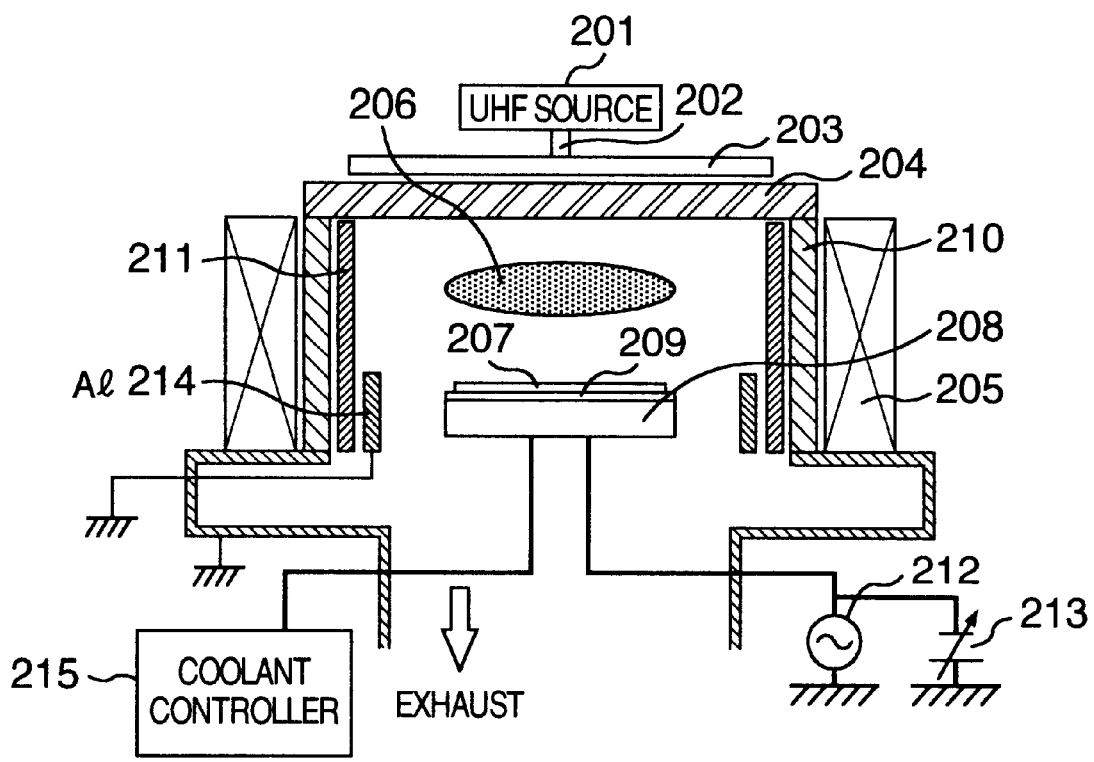
FIG. 2 is a schematic diagram illustrating a plasma processing apparatus for implementing the first embodiment of the present invention.

FIG. 2 illustrates in detail a plasma generation unit of a plasma processing apparatus to which the present invention is applied by way of example. In the embodiment, a UHF wave and a magnetic field are utilized as means for generating plasma. The UHF wave is introduced into a vacuum vessel 210 from a UHF wave source 201 through a coaxial cable 202, an antenna 203 and a UHF wave transmission window (e.g. quartz plate) 204. The inner periphery of the vacuum vessel 210 is covered by a cylindrical member 211 made of quartz or alumina and a solenoid coil 205 for producing a magnetic field in the vacuum vessel 210 is disposed around the vacuum vessel 210 so that the synergistic effect of the magnetic field and the UHF wave is utilized to generate plasma 206. A sample 207 having a diameter of 200 mm is placed on a sample stage 208 and is electrostatically attracted to the sample stage 208 through a dielectric film 209 by a DC voltage applied by a DC power supply 213. A radio-frequency (RF) power supply 212 which can be turned on continuously or turned on and off periodically and a coolant temperature controller 215 for adjusting a temperature of the sample stage 208 are connected to the sample stage 208. A ring mainly made of aluminum is disposed adjacent to a partial or all inner peripheral surface of the vacuum vessel 210 exposed to the plasma 206. In this case, the ring 214 made of aluminum having high purity is disposed opposite to the outer peripheral side of the sample stage 208 and constitutes a ground electrode for applying an electrical potential to the plasma.

The apparatus structured above is employed to introduce chlorine gas into the vacuum vessel 210 and generate the plasma 206 in the vacuum vessel 210 so that a chlorine radical and chlorine ions in the plasma, and the ring 214 of aluminum react to one another to produce a reaction product AlxCly, so that aluminum component is supplied in the plasma. In this case, since the ring 214 is connected to the ground, an ion sheath is formed between the ring and the plasma and acts to take in ions in the plasma. Accordingly, further reaction to activated elements can be accelerated. It is understood that when the mixed plasma of the chlorine component and the aluminum component is used to etch the silicon nitride layer, anisotropic etching in the vertical direction of the silicon nitride layer can be attained in the state of the increased selectivity of the silicon nitride layer to the silicon oxide layer, that is, the silicon nitride layer/silicon oxide layer.

Figure 1A:
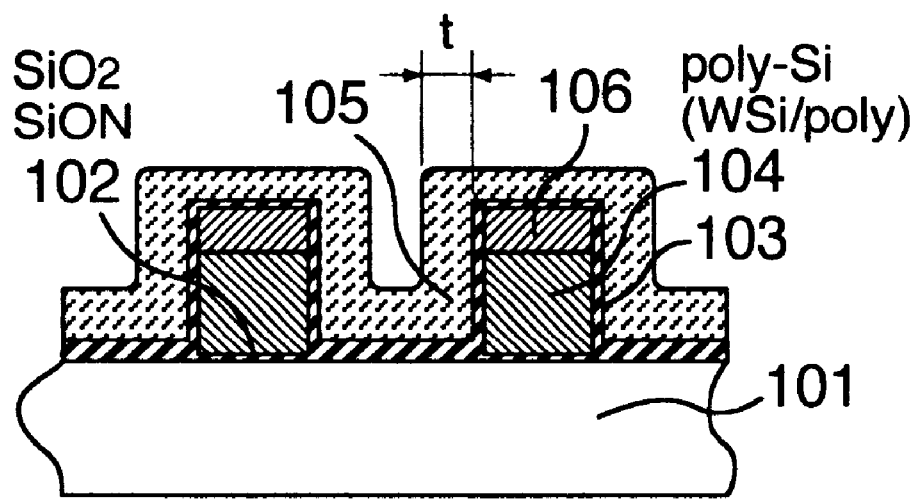
FIGS. 1A and 1B are cross-sectional views of a sample of semiconductor devices for explaining a processing characteristic of a plasma processing method according to a first embodiment of the present invention.
Figure 1B:
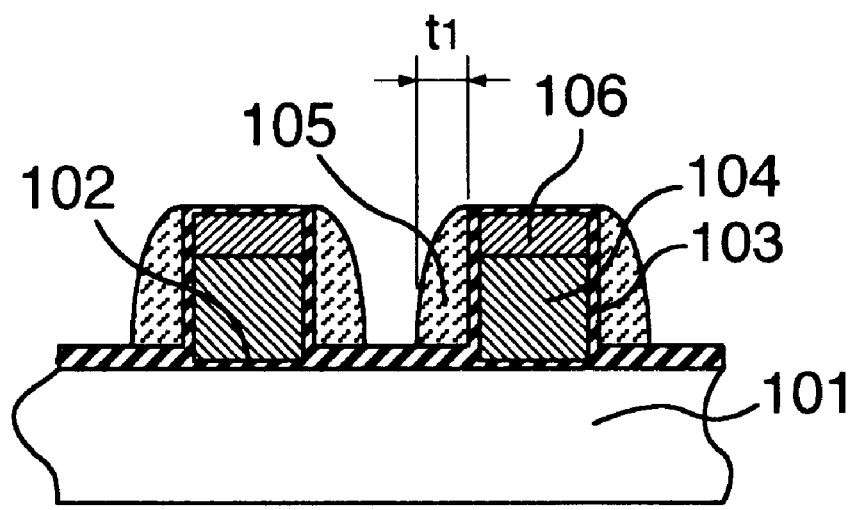

FIGS. 1A and 1B show an example of a processed device shape investigated. In FIG. 1A, when the sample including the gate oxide layer 102, the gate electrode 104, the mask 106 and the gate covering insulation layer 103 of silicon oxide formed on a semiconductor substrate 101 having a diameter of 200 mm and the silicon nitride layer 105 formed thereon is processed on condition that the flow rate of the chlorine gas, the processing pressure and the RF electric power are set to respective appropriate values so that the chlorine gas is set to 50 to 500 mL/minute, the processing pressure to 0.5 to 50.0 Pa, the electric power of the UHF wave to 300 to 800 W and the electric power of the RF power supply 212 to 20 to 100 W, anisotropic processing can be attained without narrowed silicon nitride layer (with no or reduced difference between t and $t_1$) on the side of the gate electrode 104 as shown in FIG. 1B.

As in the embodiment, the chlorine gas is introduced into the vacuum vessel 210 and the aluminum component is supplied into the vacuum vessel 210, so that the selectivity of the silicon nitride layer to the silicon oxide layer can be increased and the anisotropic etching can be attained without narrowed silicon nitride layer on the side of the gate electrode to thereby improve the processing accuracy in size of the silicon nitride layer. Further, the selectivity of the silicon nitride layer to the silicon oxide layer can be adjusted to a desired value by adjustment of the processing pressure and the RF electric power.

Figure 3:
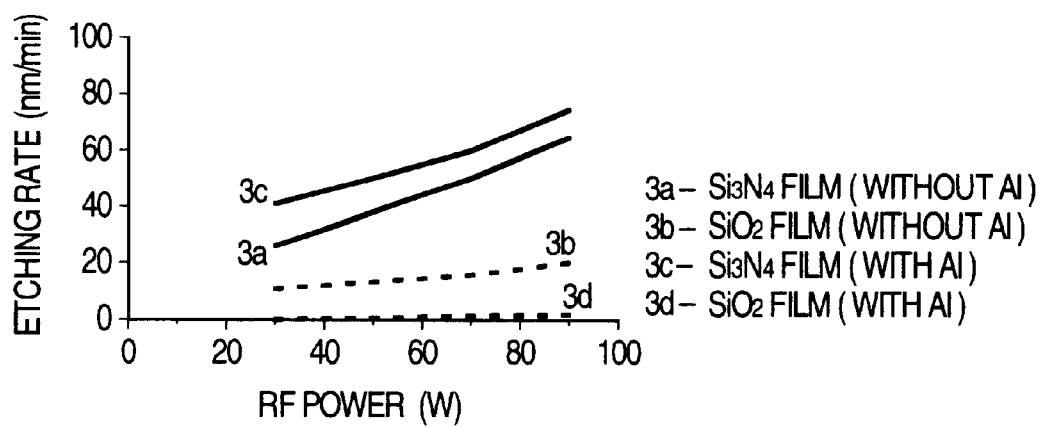
FIG. 3 is a graph showing a relation of an etching rate versus a radio-frequency (RF) electric power for various layers on condition that aluminum is provided or not in a vacuum vessel in the embodiment for explaining the effects of the present invention.

FIG. 3 shows an example of an etching rate to the RF electric power varied when the chlorine gas plasma is generated in the vacuum vessel 210 on the condition that the ring 214 is provided or not. In the embodiment, the flow rate of the chlorine gas is 170 mL/minute, the processing pressure 3.0 Pa, and the electric power of UHF wave 500 W. In FIG. 3, curves 3a and 3b represent the etching rate of the silicon nitride layer and the silicon oxide layer on the condition that the ring 214 is not provided, respectively. Curves 3c and 3d represent the etching rate of the silicon nitride layer and the silicon oxide layer on the condition that the ring 214 is provided, respectively. As understood from this graph, when the aluminum component is supplied in the vacuum vessel 210, the etching rate of the silicon nitride layer is hardly changed but the etching rate of the silicon oxide layer is reduced.

This is considered because the reaction product containing aluminum is attached on the silicon oxide layer to act as a protection layer since the reaction product formed by reaction of the silicon oxide layer and the reaction product of aluminum is harder to evaporate than the reaction product formed by reaction of the silicon nitride layer and the reaction product of aluminum.

Figure 4A:
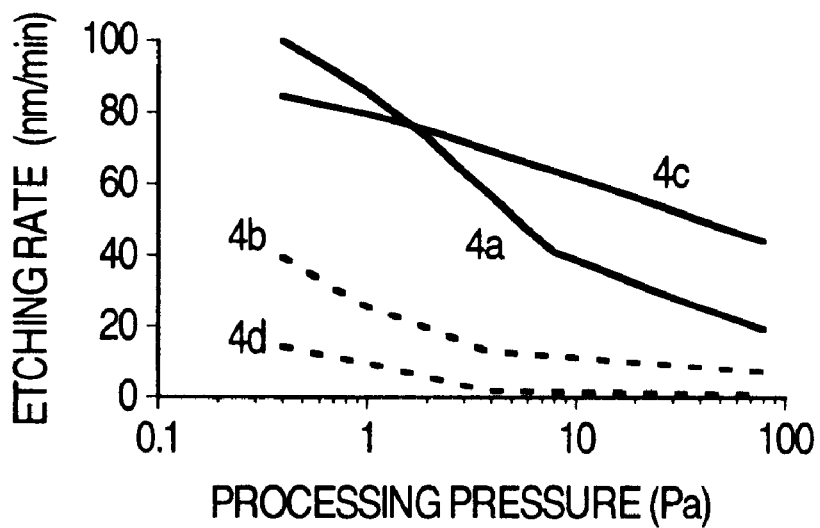
FIGS. 4A and 4B are graphs showing relations of an etching rate versus a processing pressure and a selectivity versus a processing pressure on condition that aluminum is provided or not in a vacuum vessel in the embodiment for explaining the effects of the present invention, respectively.

FIG. 4A shows an example of an etching rate to the processing pressure varied when the chlorine gas plasma is generated in the vacuum vessel 210 on the condition that the ring 214 is provided or not. In the embodiment, the flow rate of the chlorine gas is 170 mL/minute, the electric power of UHF wave 500 W, and the RF electric power 70 W. In FIG. 4A, curves 4a and 4b represent the etching rate of the silicon nitride layer and the silicon oxide layer on the condition that the ring 214 is not provided, respectively. Curves 4c and 4d represent the etching rate of the silicon nitride layer and the silicon oxide layer on the condition that the ring 214 is provided, respectively. It is understood from FIG. 4A that the etching rate of the silicon nitride layer and the silicon oxide layer is reduced as the processing pressure is increased. That is, it is considered that the processing pressure can be increased and reduced to thereby control a deposit amount of reaction product, so that the processing pressure can be increased to thereby deposit much reaction product on the silicon oxide layer and reduce the etching rate of the silicon oxide layer.

Figure 4B:
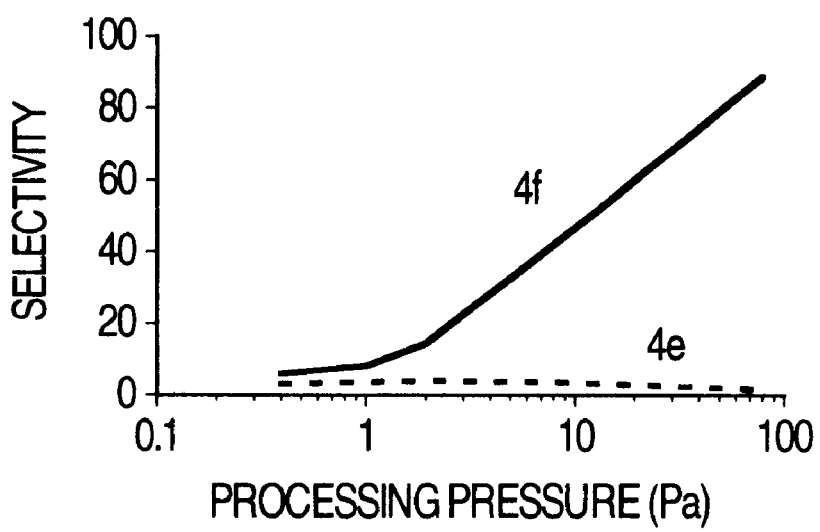

FIG. 4B shows a selectivity of the silicon nitride layer and the silicon oxide layer. A curve 4e represents a selectivity when the ring 214 is not provided and a curve 4f represents a selectivity when the ring 214 is provided. According to this result, when the aluminum component is supplied to the vacuum vessel 210, the selectivity of the silicon nitride layer to the silicon oxide layer can be controlled easily when the processing pressure is larger than 0.5 Pa.

Figure 5A:
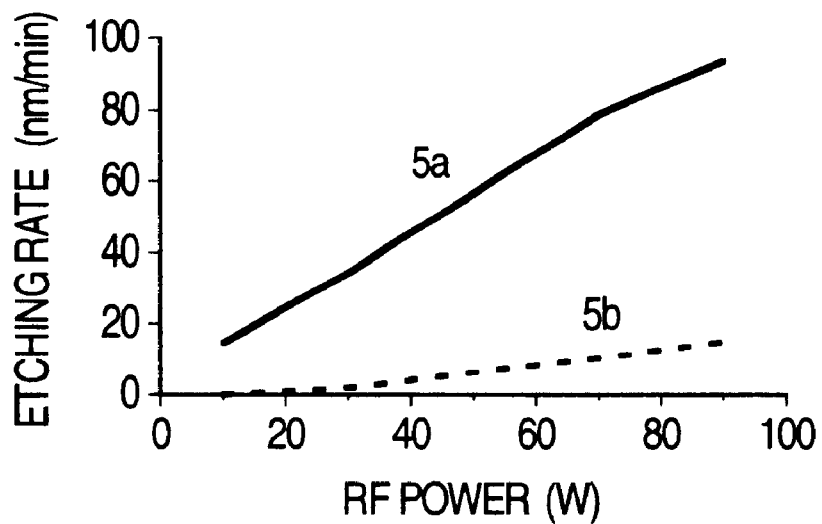
FIGS. 5A and 5B are graphs showing relations of an etching rate versus a radio-frequency (RF) electric power and a selectivity versus a RF electric power for various layers as an example for explaining the embodiment of the present invention, respectively.
Figure 5B:
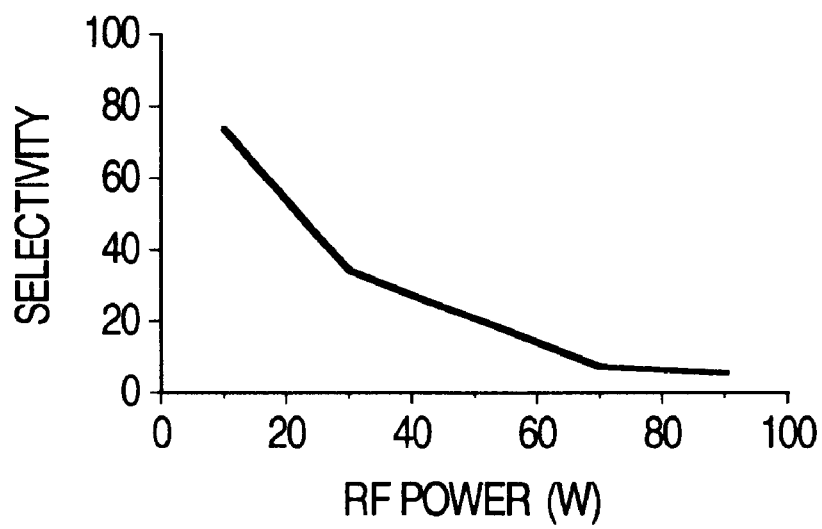

FIGS. 5A and 5B show an example of an etching rate and a selectivity to the RF electric power varied when the chlorine gas plasma is generated in the vacuum vessel 210 on condition that the ring 214 is provided, respectively. In the embodiment, the flow rate of the chlorine gas is 170 mL/minute, the processing pressure 1.0 Pa, and the electric power of the UHF wave is 500 W. In FIG. 5A, a curve 5a represents the etching rate of the silicon nitride layer and a curve 5b represents the etching rate of the silicon oxide layer. As shown in FIG. 5A, it is understood that the etching rate of both the silicon nitride layer and the silicon oxide layer is reduced as the RF electric power is lowered. That is, it is considered that the RF electric power can be increased and reduced to thereby control the acceleration voltage of chlorine ions so that the RF electric power can be reduced to thereby increase a deposit amount of reaction product on the silicon oxide layer and further reduce the etching rate of the silicon oxide layer.

FIG. 5B shows a selectivity to a RF electric power varied when the chlorine gas plasma is generated in the vacuum vessel 210 on the condition that the ring 214 is provided. According to this result, when the aluminum component is supplied to the vacuum vessel 210, the RF electric power can be adjusted to thereby control the selectivity of the silicon nitride layer to the silicon oxide layer easily.

Further, it is considered that the mechanism for turning on and off the RF electric power periodically is employed so that the turning-off time of the RF electric power can be controlled to thereby control the deposit amount of reaction product on the silicon oxide layer, so that the same effects as the above are attained.

The present invention is not specified or limited to the above embodiment. For example, in the embodiment, the ring mainly made of aluminum is disposed in the vacuum vessel, while another method may be used, for example, gas containing aluminum (aluminum compound gas such as trimethylaluminum $Al(CH_3)_3$, triethylaluminum $Al(C_2H_2)$ or dimethylaluminum halide $Al(CH_3)2H$) may be supplied in the vacuum vessel 210 together with chlorine gas which is etching gas or body material of aluminum is gasified by plasma or heat treatment in an area different from the vacuum vessel 210 constituting a processing chamber to supply its resultant gas in the vacuum vessel 210.

Figure 6:
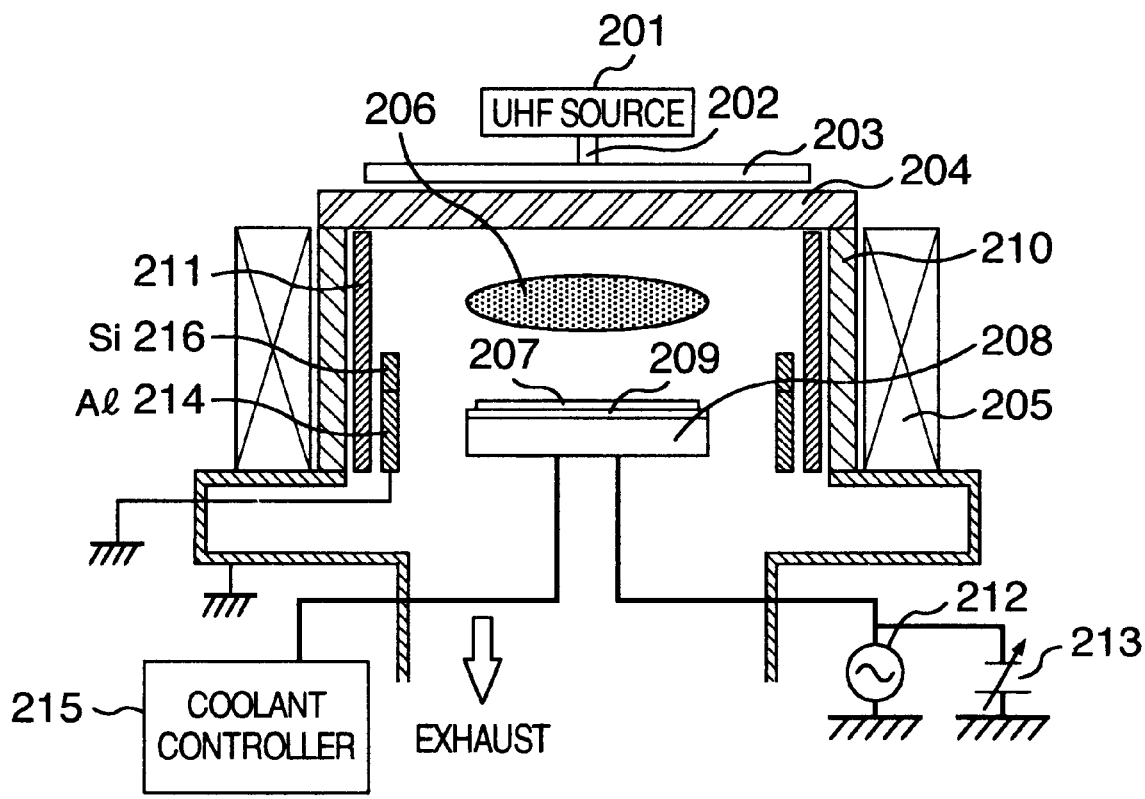
FIG. 6 is a schematic diagram illustrating a plasma processing apparatus for implementing a second embodiment of the present invention.

A second embodiment of the present invention is now described with reference to FIG. 6, which illustrates a plasma processing apparatus for implementing the second embodiment of the present invention. In FIG. 6, the same reference numerals as those of FIG. 2 represent the same elements and description thereof is omitted. The embodiment of FIG. 6 is different from FIG. 2 in that a ring 216 mainly made of silicon is disposed above the ring 214 made of aluminum.

In the structure in which the ring 216 of silicon is disposed above the ring 114 as shown in FIG. 6, the selectivity of the silicon nitride layer to the silicon oxide layer was examined. The processing conditions were as follows. The flow rate of the chlorine gas was 170 mL/minute, the processing pressure 3.0 Pa, the electric power of the UHF wave 500 W, and the RF electric power 70 W. The selectivity was 22.0 when the ring 216 was not disposed, whereas the selectivity was improved to 65.9 when the ring 216 was disposed. In the embodiment, the ring mainly made of silicon is disposed in the vacuum vessel, while another method may be used, for example, gas containing silicon (silicon compound gas such as silicon tetrachloride ($SiCl_4$) may be directly supplied in the vacuum vessel 210 or silicon may be gasified by plasma or heat treatment in an area different from the vacuum vessel 210 to supply its resultant gas in the vacuum vessel 210.

A third embodiment of the present invention is now described with reference to FIG. 7. This embodiment is different from the first embodiment in that hydrogen bromide gas is used as the etching gas instead of the chloride gas.

Figure 7:
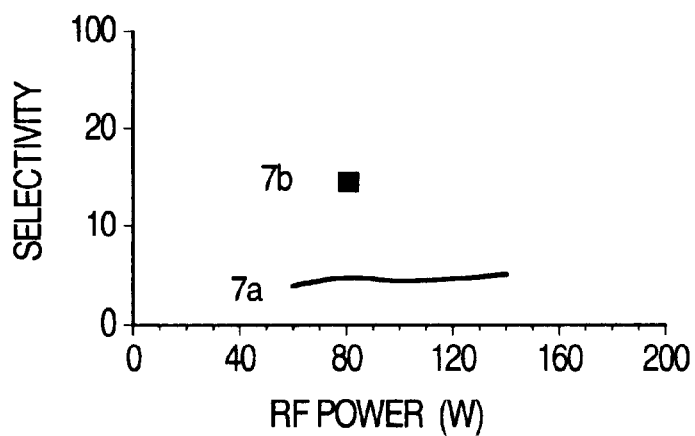
FIG. 7 is a graph showing a relation of a selectivity of a silicon nitride layer to a silicon oxide layer versus a RF electric power on condition that aluminum is provided or not in a vacuum vessel in the state that plasma of hydrogen bromide gas is generated therein for the purpose of explaining a third embodiment of the present invention.
Figure 8:
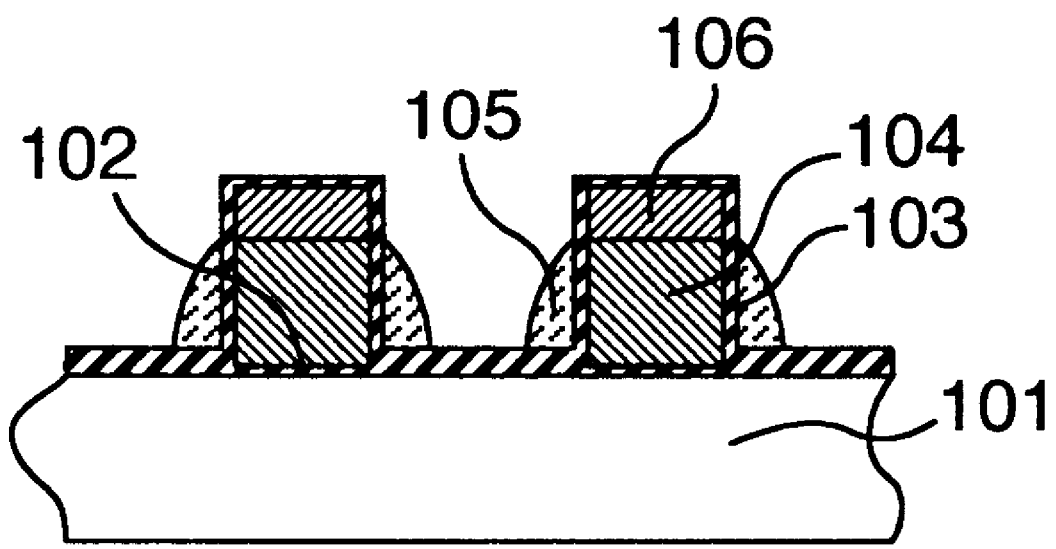
FIG. 8 shows a cross section of semiconductor devices processed by a prior-art plasma processing method.

FIG. 7 shows an example of the selectivity to the RF electric power varied when hydrogen bromide gas plasma is generated in the vacuum vessel 210 on the condition that the ring 214 is provided or not. In the embodiment, the flow rate of the hydrogen bromide gas is 200 mL/minute, the processing pressure 4.0 Pa, and the electric power of the UHF wave 500 W. In FIG. 7, a curve 7a represents the selectivity of the silicon nitride layer and the silicon oxide layer when the ring 214 is not provided and a curve 7b represents the selectivity of the silicon nitride layer and the silicon oxide layer when the ring 214 is provided. According to this result, it is understood that even in the hydrogen bromide gas plasma, when the aluminum component is supplied to the vacuum vessel 210, the selectivity of the silicon nitride ratio and the silicon oxide layer is improved. Further, it is considered that even when iodine gas is used, the same effects can be attained.

In the embodiments, the ring 214 is connected to the ground, while even when the ring is electrically floated to expose the plasma, the same effects can be attained.

Further, the present invention can be applied to not only an ECR (electron cyclotron resonance) plasma system but also processing apparatuses using the reactive ion etching, the magnetron etching and the inductively coupled plasma etching.

According to the present invention, when the silicon nitride layer on the silicon oxide layer formed on the semiconductor substrate is processed, a mixed atmosphere of halogen-containing gas with aluminum is converted in converted into plasma, whereby the selectivity of the silicon nitride layer to the silicon oxide layer of the underlayer can be increased and the processing characteristic having the excellent processing accuracy in size can be obtained.

What is claimed is:

1. A plasma processing method comprising the steps of:

converting a mixed atmosphere of halogen-containing gas with aluminum into plasma by using a plasma processing apparatus including a vacuum vessel, means for generating said plasma in said vacuum vessel, a sample stage on which a sample having a surface to be processed by said plasma is placed, and a power supply for applying a radio-frequency bias voltage to said sample stage; and etching a silicon nitride layer on a silicon oxide layer formed on a semiconductor substrate by using said plasma, wherein aluminum is supplied into said plasma in said vacuum vessel from a different area capable of supplying aluminum-containing gas.

2. A plasma processing method comprising the steps of:

converting a mixed atmosphere of halogen-containing gas with aluminum into plasma by using a plasma processing apparatus including a vacuum vessel, means for generating said plasma in said vacuum vessel, a sample stage on which a sample having a surface to be processed by said plasma is placed, and a power supply for applying a radio-frequency bias voltage to said sample stage; and etching a silicon nitride layer on a silicon oxide layer formed on a semiconductor substrate by using said plasma, wherein silicon is disposed in said plasma processing apparatus and a mixed atmosphere of halogen-containing gas, aluminum and said silicon is converted into plasma, wherein a part exposed to said plasma in said vacuum vessel is made of material containing silicon as a main component and said silicon is supplied into said plasma from said part.

3. A plasma processing method according to claim 2, wherein said material containing silicon as a main component is connected to a ground potential in said vacuum vessel.

* * * * *